(12) United States Patent
JangJian et al.

(10) Patent No.: US 8,890,273 B2
(45) Date of Patent: Nov. 18, 2014

(54) METHODS AND APPARATUS FOR AN IMPROVED REFLECTIVITY OPTICAL GRID FOR IMAGE SENSORS

(75) Inventors: Shiu-Ko JangJian, Tainan (TW); Kei-Wei Chen, Tainan (TW); Ying-Lang Wang, Tien-Chung Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 35 days.

(21) Appl. No.: 13/363,280

(22) Filed: Jan. 31, 2012

(65) Prior Publication Data

US 2013/0193538 A1   Aug. 1, 2013

(51) Int. Cl.
*H01L 31/00* (2006.01)
*H01L 31/0224* (2006.01)

(52) U.S. Cl.
CPC ... *H01L 31/022441* (2013.01); *H01L 31/022433* (2013.01)
USPC ............................ 257/459; 257/460

(58) Field of Classification Search
CPC ............... H01L 31/022433; H01L 31/022441; H01L 31/02245; H01L 31/022458
USPC .................... 257/459, 460; 438/98
See application file for complete search history.

(56) References Cited

U.S. PATENT DOCUMENTS

| 2005/0205960 A1* | 9/2005 | Nagashima et al. .......... 257/486 |
| 2008/0136989 A1* | 6/2008 | Higaki et al. ................ 349/46 |
| 2009/0101919 A1* | 4/2009 | Yao ................................ 257/85 |
| 2010/0091163 A1 | 4/2010 | Liao et al. |
| 2010/0163932 A1* | 7/2010 | Jun ............................... 257/225 |
| 2011/0018144 A1* | 1/2011 | Horiuchi et al. .............. 257/784 |

* cited by examiner

*Primary Examiner* — Kevin Parendo
(74) *Attorney, Agent, or Firm* — Slater & Matsil, L.L.P.

(57) ABSTRACT

An improved reflectivity optical grid for image sensors. In an embodiment, a backside illuminated CIS device includes a semiconductor substrate having a pixel array area comprising a plurality of photosensors formed on a front side surface of the semiconductor substrate, each of the photosensors forming a pixel in the pixel array area; an optical grid material disposed over a backside surface of the semiconductor substrate, the optical grid material patterned to form an optical grid that bounds each of the pixels in the pixel array area and extending above the semiconductor substrate, the optical grid having sidewalls and a top portion; and a highly reflective coating formed over the optical grid, comprising a pure metal coating of a metal that is at least 99% pure, and a high-k dielectric coating over the pure metal coating that has a refractive index of greater than about 2.0. Methods are also disclosed.

15 Claims, 11 Drawing Sheets

METHODS AND APPARATUS FOR AN IMPROVED REFLECTIVITY OPTICAL GRID FOR IMAGE SENSORS

BACKGROUND

Continuing use of digital cameras including still and video cameras on portable devices has created a demand for image sensors. The use of cameras on portable and battery powered devices such as tablet computers, smartphones, laptops and web-based video players continues to increase.

Early digital cameras primarily relied on charge coupled devices ("CCDs") as image sensors. More recently CMOS image sensors ("CIS") have become increasingly prevalent. CCIS technology provides a digital device, as opposed to an analog device, and because the CIS uses CMOS transistor or diode technology, additional digital processing and logic circuitry may easily be incorporated into an imaging integrated circuit. The efficiency of light gathering (quantum efficiency or "QE") may be greater than that achieved with a CCD device.

A CIS device is based on a light sensitive photo-diode, which may be formed as a diode or as part of a transistor, a "photo-transistor". When the photo-diode is exposed to light, electrons flow in proportion to the light, and a voltage signal may be produced that indicates the amount of light received in a given time period. This signal is then converted to a digital signal and circuitry on the device may output the signal. An array of picture elements ("pixels") is formed on the semiconductor device. Additional circuitry may be formed outside of the array to provide digital signal processing such as filtering, and image processing, for example, and to provide interface circuitry to a system.

Originally front side illuminated ("FSI") arrays were used with CIS devices. However the light impinging on a photo-sensor in a FSI CIS has to pass through layers of metal and dielectric that may absorb or scatter the impinging light, thus reducing the quantum efficiency. The need for use of the devices in low light conditions results in a demand for a high QE. Back side illuminated ("BSI") CIS devices have been developed. By receiving incoming light from the backside of the semiconductor substrate, the light path may be made short and without the intervening layers of metal and dielectric. By using wafer thinning and with the use of epitaxial semiconductor layers, the substrate may be further thinned or even removed and the photo-sensor is then very near the surface of the backside of the device, greatly increasing the QE. BSI CIS devices are increasingly prevalent in current products.

BRIEF DESCRIPTION OF THE DRAWINGS

For a more complete understanding of the illustrative embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that an illustrative embodiment provides many applicable inventive concepts that can be embodied in a wide variety of specific contexts. The specific embodiments discussed are merely illustrative of specific ways to make and use the embodiments, and these examples do not limit the scope of this description and do not limit the scope of the appended claims.

The embodiments herein are illustrative examples but do not limit the scope of the disclosure and do not limit the scope of the appended claims. Embodiments of this disclosure include methods and apparatus for forming an optical grid on a BSI CIS device. By increasing the reflectivity of the optical grid, signal to noise ratios may be improved, absorption may be reduced, and pixel interference may be reduced, so that device QE is increased.

In the embodiment methods an optical grid is formed from a metal or dielectric over a sensor array. A coating of a pure metal is formed over the grid lines. A second coating of a dielectric such as a high-k dielectric is formed. A final coating of a dielectric is formed as a passivation layer over the optical grid. The optical grid thus formed has a high reflectivity and low extinction coefficient and does not absorb light, in contrast to a conventional metal used as an optical grid. Use of the embodiment optical grid material prevents optical cross talk between pixel areas and increases signal to noise performance.

Although the embodiments are described with respect to illustrative examples in a specific context, namely forming a highly reflective optical grid for a BSI CIS device, the use of the embodiments may also be used to provide a reflective coating over a metal for other uses. For example the embodiment methods and structure could be used with a front side illuminated CIS sensor, a CCD array, or other application where high reflectivity of a metal is required. The embodiment methods and apparatus are not limited to the example processes described herein and the illustrative examples do not limit the appended claims.

An optical grid overlying an image sensor can provide additional performance by preventing pixel to pixel optical cross talk, and by improving the signal to noise ratio. In optical systems, metals such as aluminum (Al) and silver (Ag) are conventional choices due to their high reflectivity performance. For example, in visual light at about 550 nanometer wavelength, Ag shows the best reflectivity (~98%)

while Al shows good performance (~92%). In addition Al shows not only good reflectivity at the ultraviolet region (~93%) but also has good performance in the infrared region. As a result Al is widely used for optical thin film applications. However, Al also exhibits low chemical resistance (is subject to damage by, for example, subsequent chemical processes) and oxidizes easily, forming AlOx films. Adhesion to Al is also sometimes less than desired when covered by other materials. Similarly, Ag oxidizes easily in the atmosphere to form AgOx film (e.g., tarnish).

Further, although these metals are reflective for certain wavelength light, certain light is also absorbed, depending on the material chosen and the thickness. Absorption may range from 30 to 100% for certain light wavelengths. In a CIS device, this characteristic can substantially reduce light quality/quantity to the pixel array (resulting in reduced QE).

The embodiments of this application provide a "mirror" coating concept on an optical grid system for a BSI CMOS imaging sensor device. Coatings including a metal and a high-k dielectric are provided to increase reflectivity of the optical grid to at least 95% or greater. This can significantly increase the QE, light quality and light quantity that are supplied to the photosensors in the substrate. The grid will also provide improved signal to noise performance with reduced pixel to pixel optical cross talk.

Figure 1:
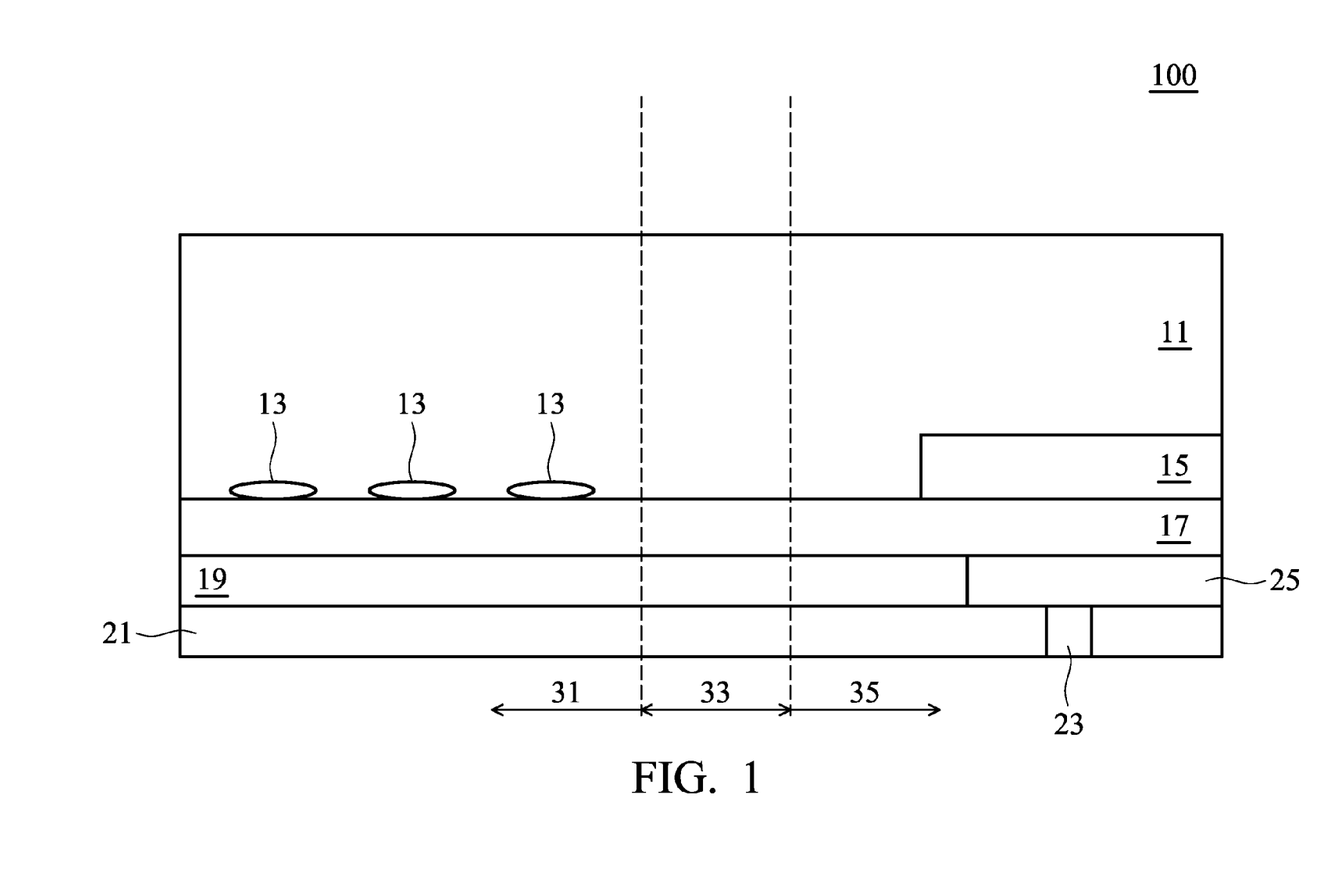
FIG. 1 depicts a cross-sectional view of a structure at an intermediate process step to illustrate the use of the embodiments.

FIG. 1 depicts in a cross-sectional view a device 100 at a first intermediate process stage for forming a BSI CIS incorporating the embodiments. A semiconductor substrate 11 is shown with the backside oriented upwards as shown in FIG. 1. This is an arbitrary orientation for purposes of illustration; the device may be rotated of course. Note that the substrate 11 may be a silicon substrate or other semiconductor material. Gallium arsenide, germanium, silicon carbide, indium arsenide or indium phosphide or alloy semiconductors such as silicon germanium carbide, gallium indium phosphide, gallium indium arsenide, and the like may be used. The substrate may typically be a wafer of semiconductor material. Wafer level processing ("WLP") may be used with the embodiments and is contemplated as providing additional embodiments, although it is not required for all embodiments. In still other embodiments the substrate 11 could instead be provided as an epitaxial layer over an insulator, such as an "SOI" layer. Wafers of semiconductor material may be bonded or stacked and the semiconductor substrate may be one of these layers. Substrate 11 is typically thinned by wafer grinding methods such as chemical-mechanical polishing ("CMP"), mechanical wafer grinding or semiconductor etch. In some embodiments, the substrate 11, after thinning, may be as little as 2.0 microns or greater in thickness. T In FIG. 1, a pixel array area 31 is shown, with a metal shield area 33, and a peripheral area 35. In the array area 31 of the substrate 11, sensors 13 are shown. In this example, three pixel sensors 13 are shown. These may be, for example, a photo-diode or alternatively, the sensors may be a source/drain region of a photo-transistor. Note that in this cross-sectional view only three sensors 13 are shown for simplicity; however, in a practical device, an array of hundreds or thousands or more pixel sensors will be provided, typically arranged in rows and columns. The sensors 13 are shown as diffusions or doped regions extending into the "front side" of substrate 11. The substrate may include an epitaxial layer and sensors 13 may be formed in the epitaxial layer. The substrate 11 may include p or n type wells that are doped, and the sensors 13 may be formed of oppositely doped diffused regions within a well. The sensors 13 may be a photo-diode, and a photo-diode may include a P-N junction, and sensors 13 may include a "pinned" photo-diode. Various other elements may be included in each sensor 13 including a transistor, for example, a transfer transistor to output a voltage corresponding to the photons collected in the photo-diode during a sample period.

Area 33 will be shielded with an overlying metal portion and provides a "BLC" or black level correlation for the sensors 13. This area will not receive any photons and will thus provide a comparison for use in sensing operations, to enable circuitry to subtract "black noise" from sensed levels and increase the performance of the pixels. Area 35 in substrate 11 is an area outside of the pixel array area 31 used for connectivity and for additional logic functions outside of the array area. In FIG. 1, an isolation region 15 may be, for example, a shallow trench isolation ("STI") area formed into the substrate 11. Alternatives include local oxidation of silicon ("LOCOS") isolation. An interlevel dielectric layer 17, such as an oxide layer, is shown overlying the substrate. An intermetal dielectric 19 is shown for the first metal layer, and a metal pad 25 is shown. This may provide a conductor for coupling the array to an external pad or solder connector, for example. A via 23 is shown extending through intermetal dielectric 21 coupling metal pad 25 to another layer, not shown. The substrate 11 may include many interlevel dielectric and intermetal dielectric layers and metal layers to provide mapping and connectivity to the sensors 13, and to other circuitry on the device, and to external connectors. Since the illumination of the device 100 is from the back side, or the top surface in FIG. 1, there is no problem with using a variety of layers over the sensors 11 on the front side of substrate 11, which is oriented on the bottom surface of the substrate 11 as shown in FIG. 1.

Figure 2:
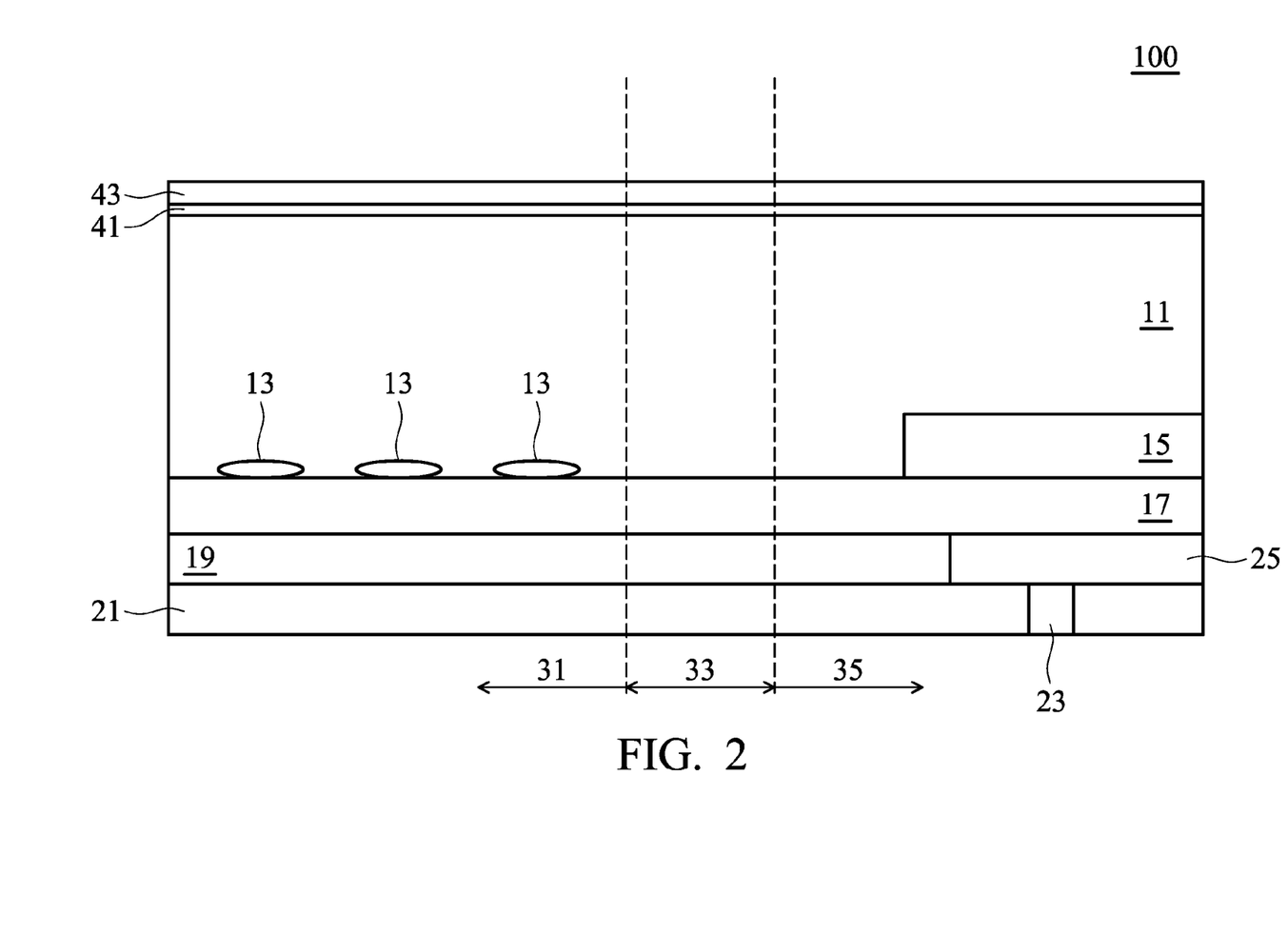
FIG. 2 depicts in a cross-sectional view the structure of FIG. 1 following additional processing.

FIG. 2 depicts the device 100 following additional process steps. In FIG. 2, a coating such as an antireflective coating ("ARC") 41 is shown overlying the backside (upper surface as shown in FIG. 2) of the substrate 11, this coating may be an organic material, for example. A dielectric coating 43 such as an oxide is shown covering the ARC layer 41.

Figure 3:
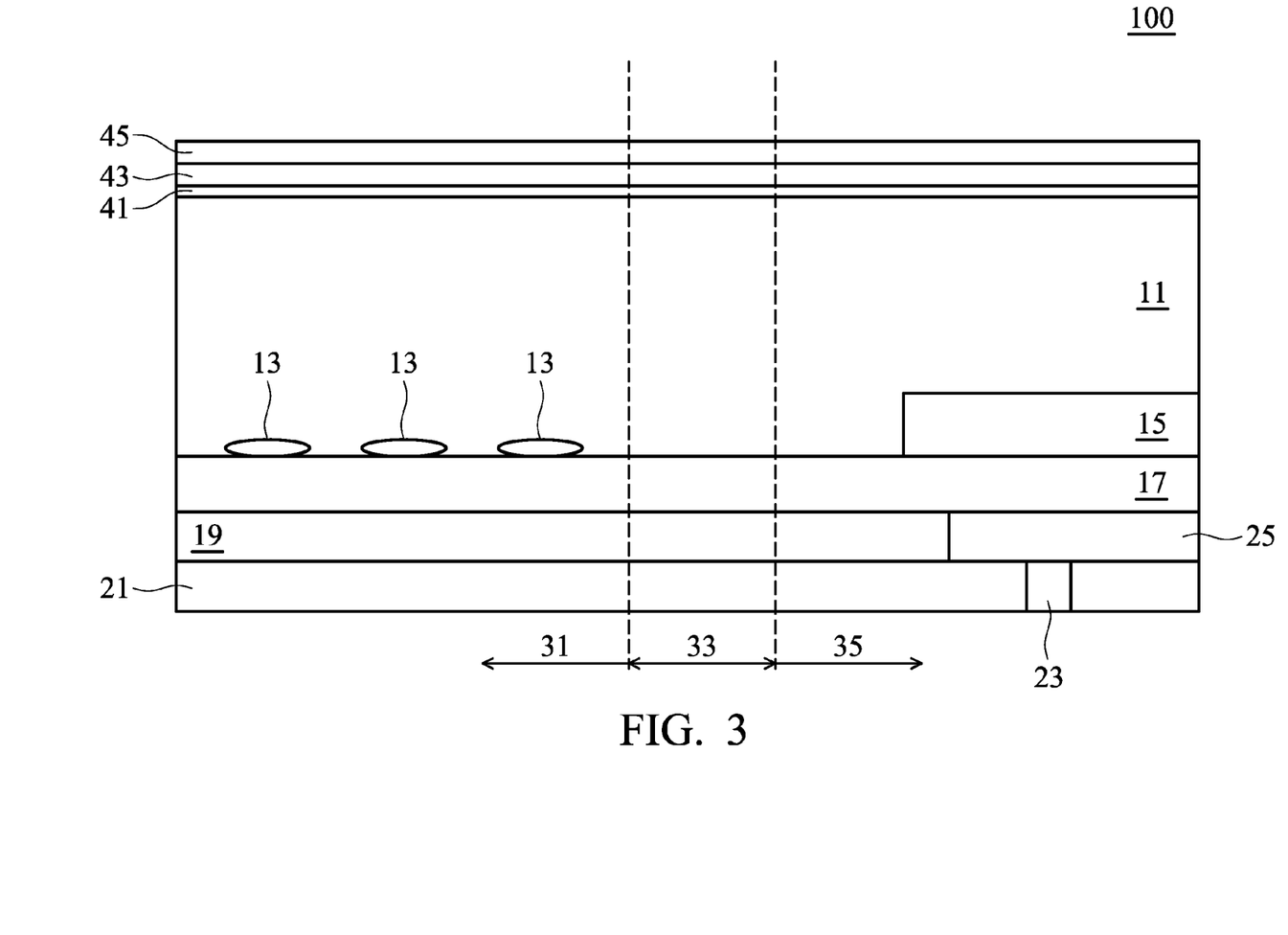
FIG. 3 depicts in a cross-sectional view the structure of FIG. 2 following additional processing.

In FIG. 3, the device 100 is shown following additional processing steps. In FIG. 3 a layer of a material for forming the optical grid 45 is deposited over the substrate 11. Layer 45 may be, for example, conveniently selected from materials used as conductors such as Al or copper (Cu) formed by electrochemical plating ("ECP"). A seed layer may be sputtered over the substrate for example, and the remaining layer may be formed by ECP. In addition to metal materials, other materials such as dielectric materials having an extinction value k>0 may be used. In an example, aluminum (Al) was used.

Figure 4:
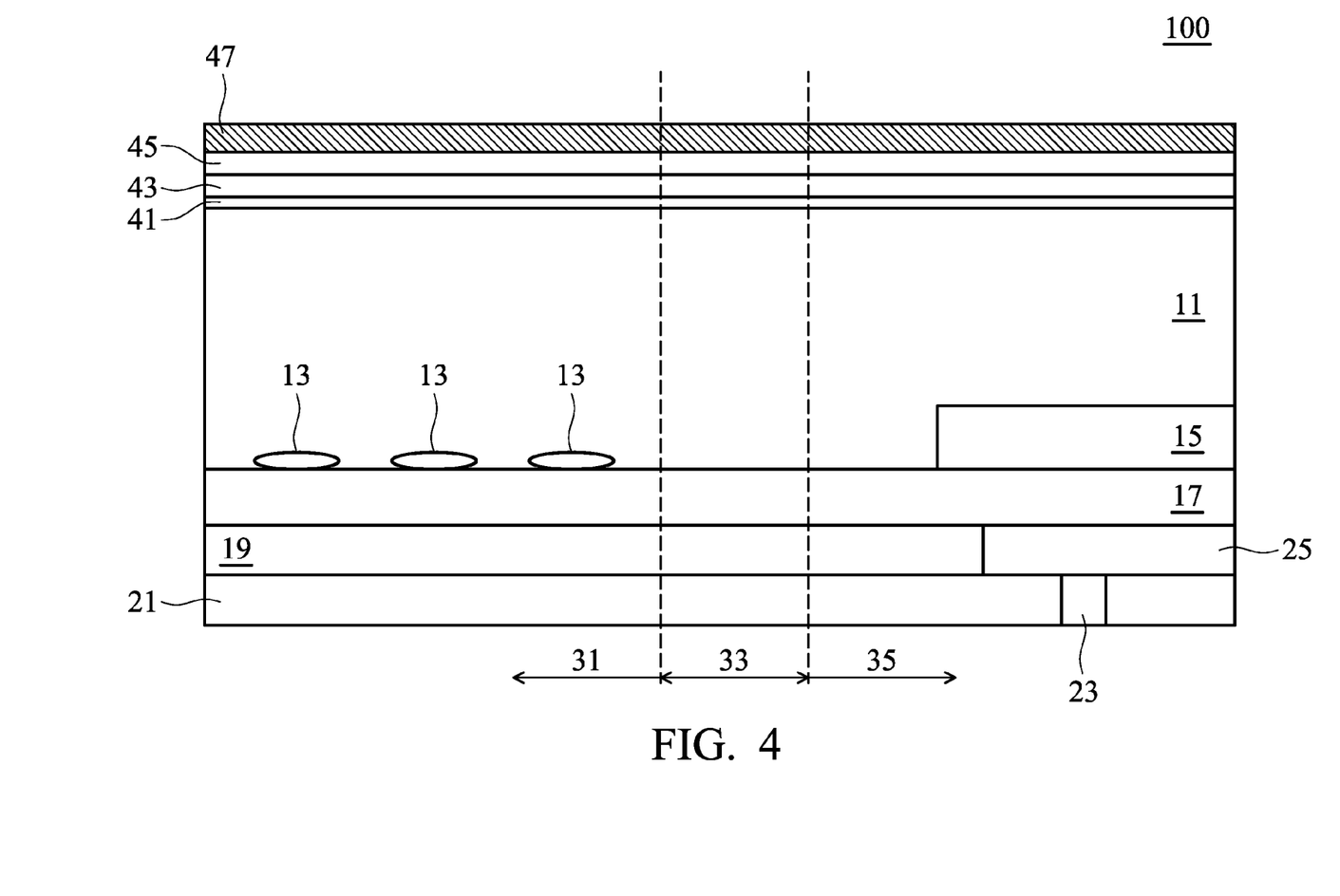
FIG. 4 depicts in a cross-sectional view the structure of FIG. 3 following additional processing.

In FIG. 4, the device 100 is shown following additional processing steps. In FIG. 4 a photoresist ("PR") layer 47 is shown formed over the grid layer 45. PR 47 is used to pattern the base material of optical grid layer 45 to form a grid pattern, separating each pixel area from the neighboring pixel areas.

Figure 5:
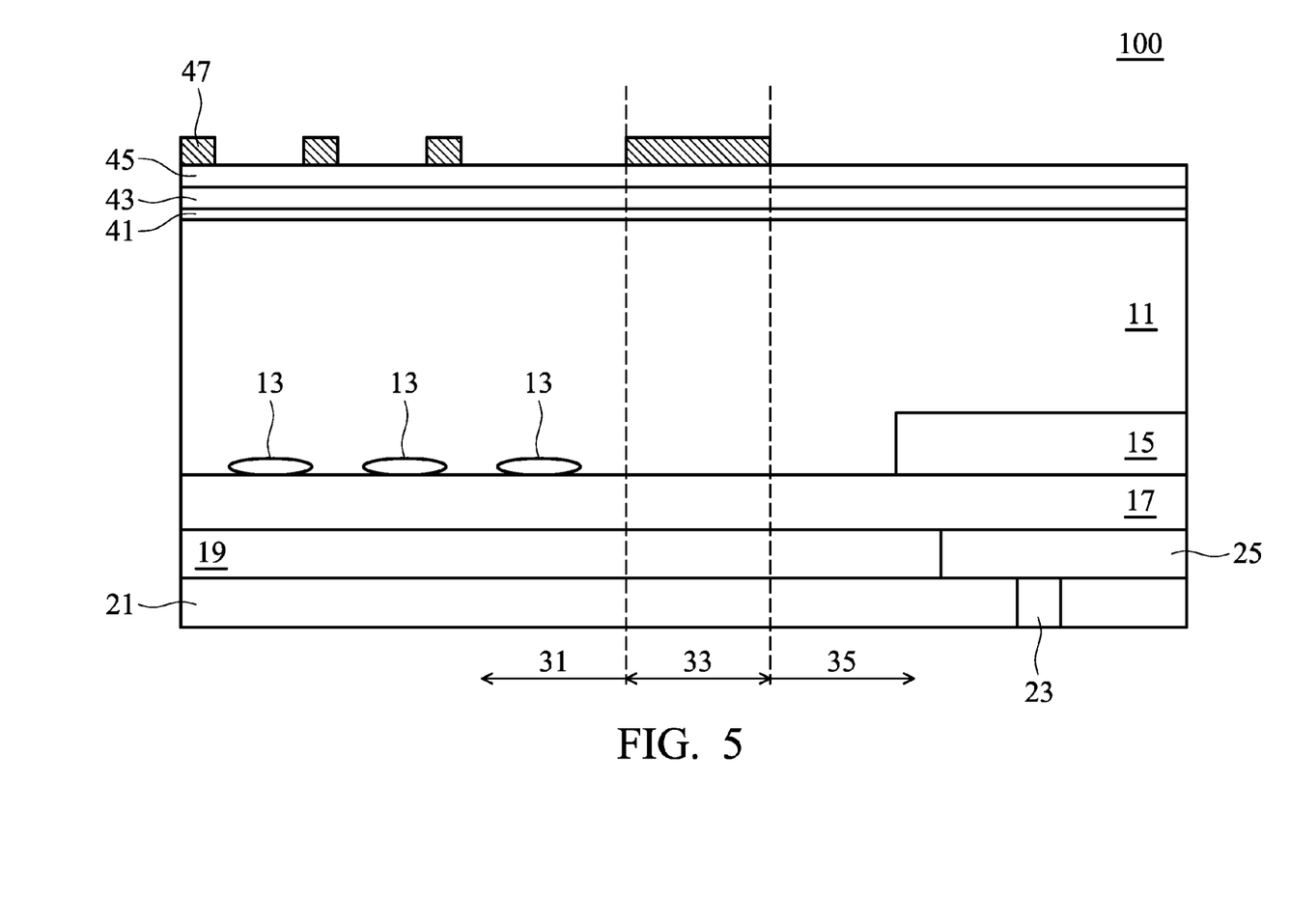
FIG. 5 depicts in a cross-sectional view the structure of FIG. 4 following additional processing.

FIG. 5 shows the device 100 in cross-sectional view following additional process steps. In FIG. 5, the photoresist layer 47 is shown after photolithographic patterning, including exposure using an optical pattern mask, exposing the layer 47 to light, or excimer laser energy, a cure or hardening step, and developing the photoresist 47 to form the pattern shown.

Figure 6:
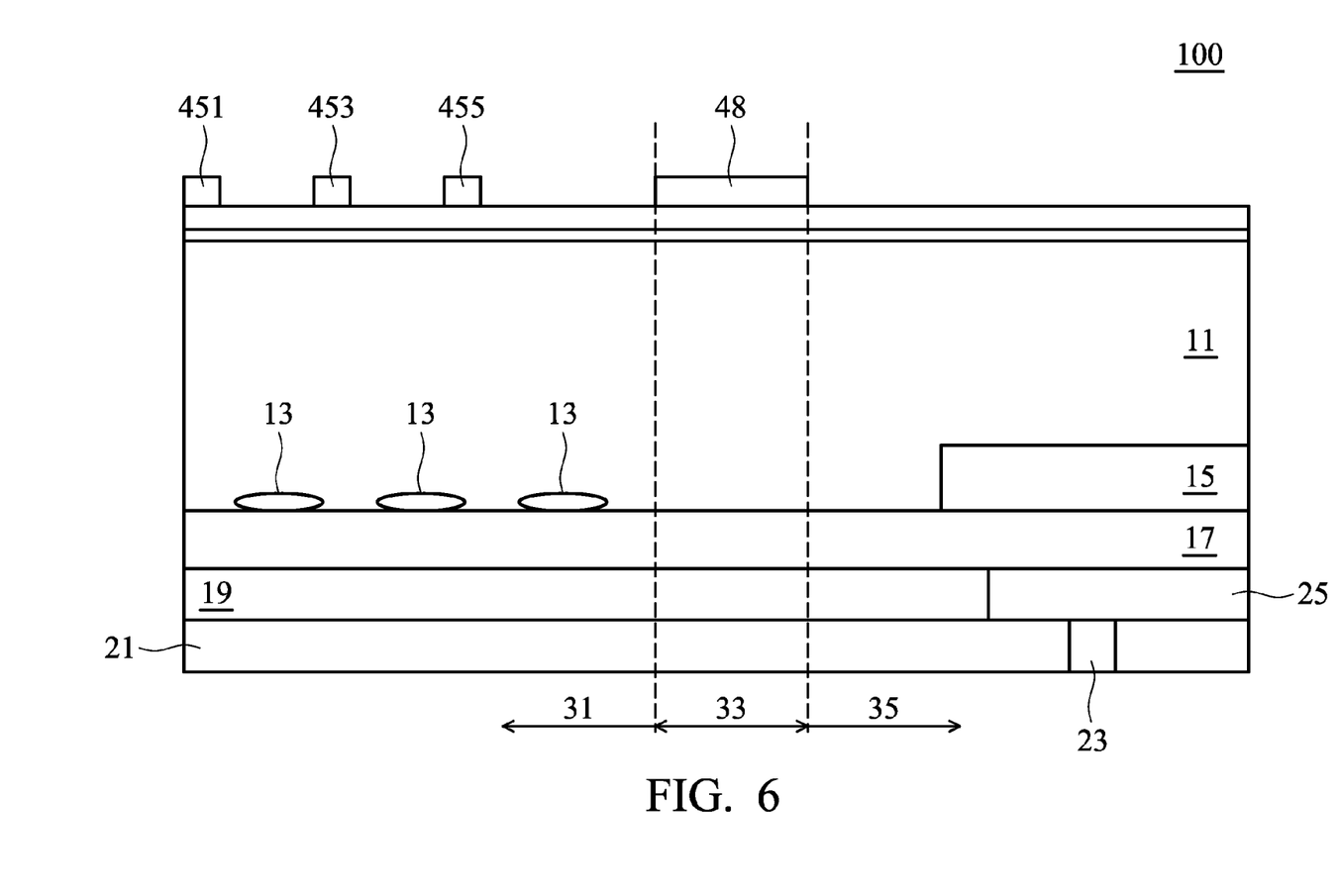
FIG. 6 depicts in a cross-sectional view the structure of FIG. 5 following additional processing.

FIG. 6 depicts the device 100 in a cross-sectional view following the etching steps of layer 45, the optical grid material. In FIG. 6, the layer 45 is patterned to form an optical grid having sections 451, 453, 455 and a metal shield section 48. The remaining material is removed. Conventional metal etch processes can be used, and then, the remaining photoresist is removed for example by a PR strip or ashing step. Each portion of the optical grid 451, 453, 455 is connected to the others and bounds a pixel area.

Figure 7:
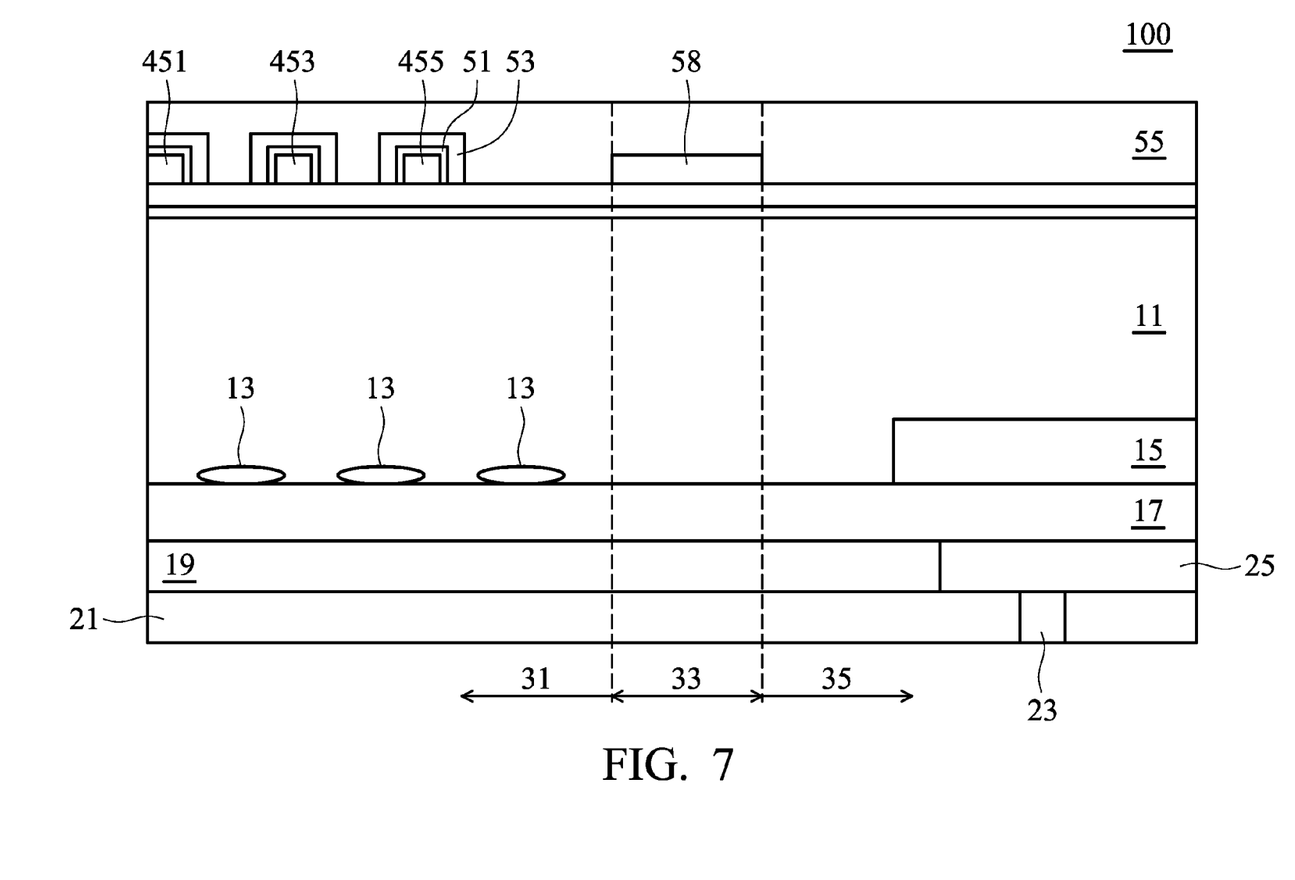
FIG. 7 depicts in a cross-sectional view the structure of FIG. 6 following additional processing illustrating an embodiment.

FIG. 7 depicts the device 100 in a cross-sectional view following additional processing steps to complete the reflective coating of an example embodiment. In FIG. 7, each of the optical grid sections 451, 455, 453 is shown having a first metal coating 51, a high-k dielectric coating 53, and then a passivation dielectric layer 55 is provided over the entire substrate to provide optical optimization and passivation for the device.

Figure 8:
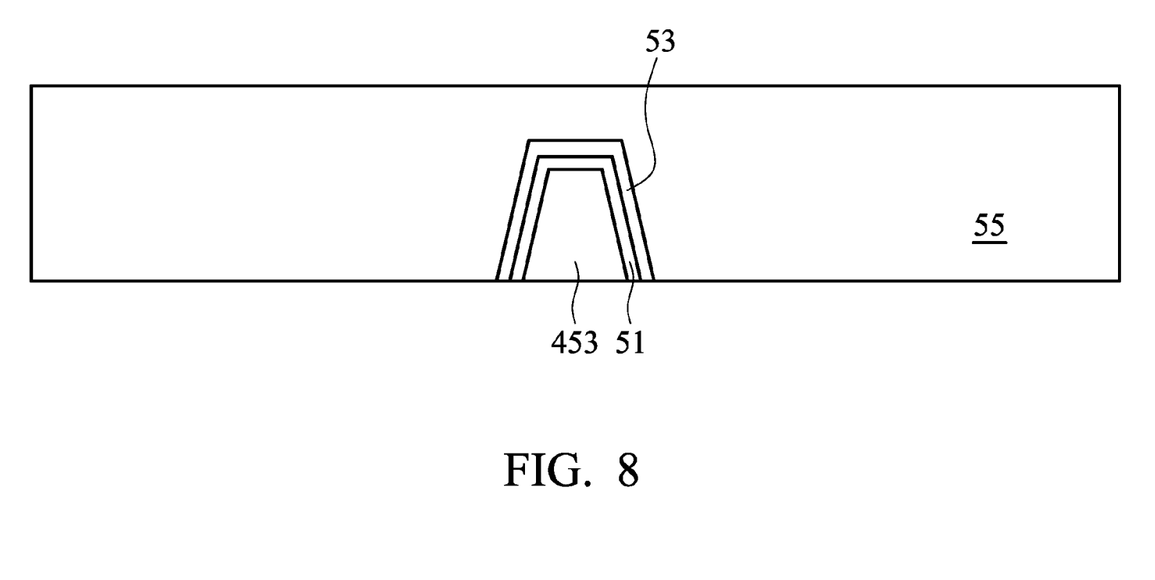
FIG. 8 depicts in a cross-sectional view the a portion of the structure of FIG. 7.

FIG. 8 depicts one portion of optical grid 453 of FIG. 7 in a cross-section and in a close-up view. A. A pure metal coating 51, for example of Al or Cu, is provided over the top and sidewalls of the optical grid section 453. This pure metal coating may be >99% pure, and in one example was >99.9% pure Al. The Al or Cu metal thickness may be from 20 nanometers to 100 nanometers, for example. This layer may be formed by a plasma vapor deposition ("PVD") process, for example. After this coating is formed, a high-k dielectric material 53 is formed over the pure metal 51 having a refractive index n, for example, greater than 2. This high-k dielectric may be any high k material with a refractive index greater than about 2, such as for non-limiting examples tantalum based oxides, TaOx, titanium base oxides including TiOx, aluminum oxides such as Al2O3, and other similar dielectric materials. A high-k dielectric has a dielectric constant k greater than that of silicon dioxide, or about 3.8. In embodiments, the high-k dielectric may have a dielectric constant k even higher; for example, greater than 9.0. The high-k dielectric may have a thickness from 10 nanometers to 100 nanometers deposited by CVD or PVD process, for example. Processing steps for forming the pure metal 51 and the dielectric layer 53 may pattern these layers separately, or, together, to form the structures as shown in FIG. 8. Finally a passivation layer 55 is provided over the optical grid portions such as 453. The passivation layer may be, for example, an oxide with a lower refractive index, n<2, such as silicon rich SiO2 for example. This layer should not refract or reflect, unlike the coatings on the optical grid portions 451, 453, and 455 of layer 45.

When the coatings of pure metal, high refractive index dielectric and the passivation layer are used, the reflectivity of the optical grid material 45 is greatly increased. For example, for an aluminum metal grid with a pure aluminum coating, the reflectivity may be greater than 95% and may be greater than 98%. Thus the use of the embodiment mirror coatings increases reflectivity, and enhances QE for the BSI CIS device.

Figure 9:
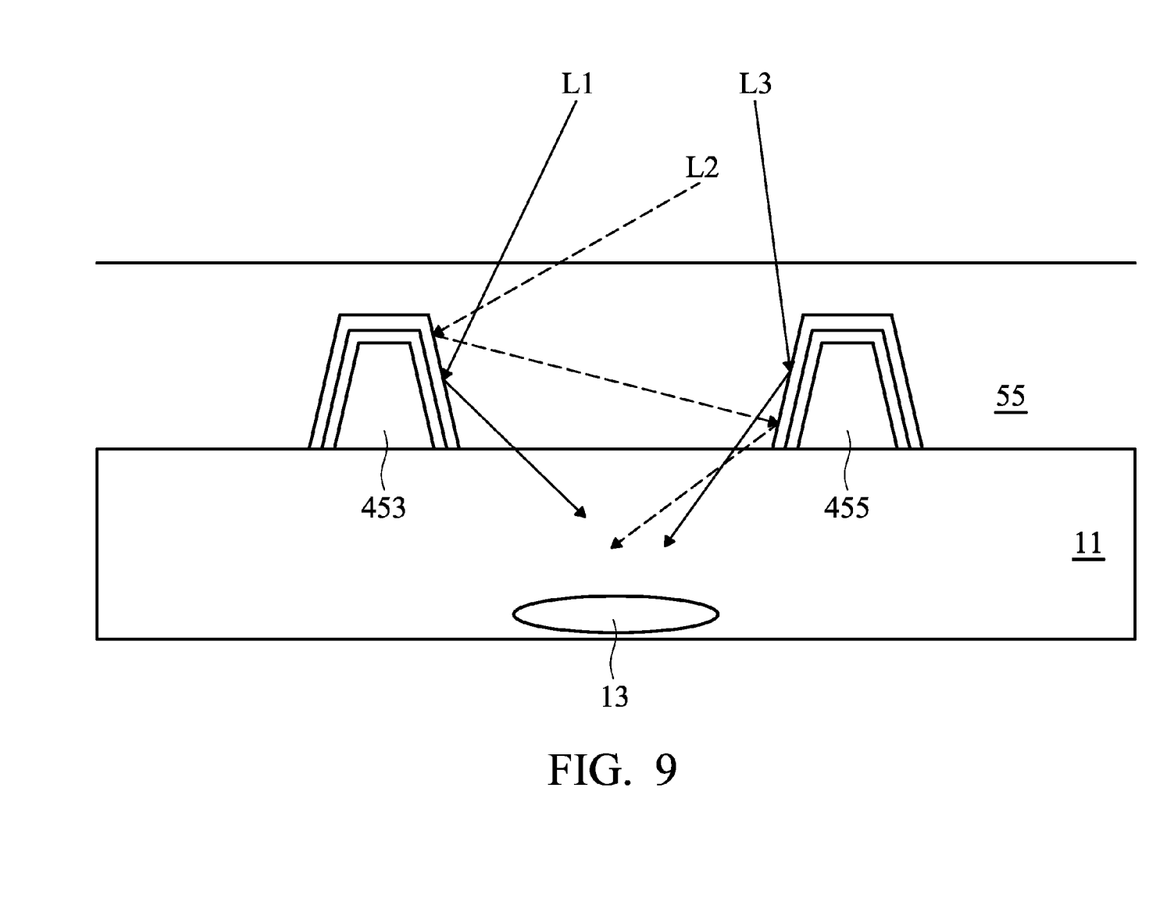
FIG. 9 depicts in a cross-sectional view a portion of the structure of FIG. 7 to illustrate the use of the embodiments.

FIG. 9 illustrates in a cross-sectional view, the operation of the embodiments. Two portions of the optical grid material 45, which bound a pixel area, are shown. These are 453 and 455, for example, from FIG. 7. Each has the pure metal coating and the highly refractive dielectric oxide coating on the sidewalls and top of the optical grid portions, to increase reflectivity. Light photons L1, for red, L2, for green, L3, for blue, for illustrative examples, that impinge on the optical grid portions 453, 455 are reflected into the substrate and are not absorbed, thus increasing the efficiency. Placing the optical grid material 45 between pixel sensor sections improves the signal to noise ratio and reduces pixel to pixel optical cross talk by reflecting the light into the nearest sensor 13, and not into adjacent pixel areas.

Figure 10:
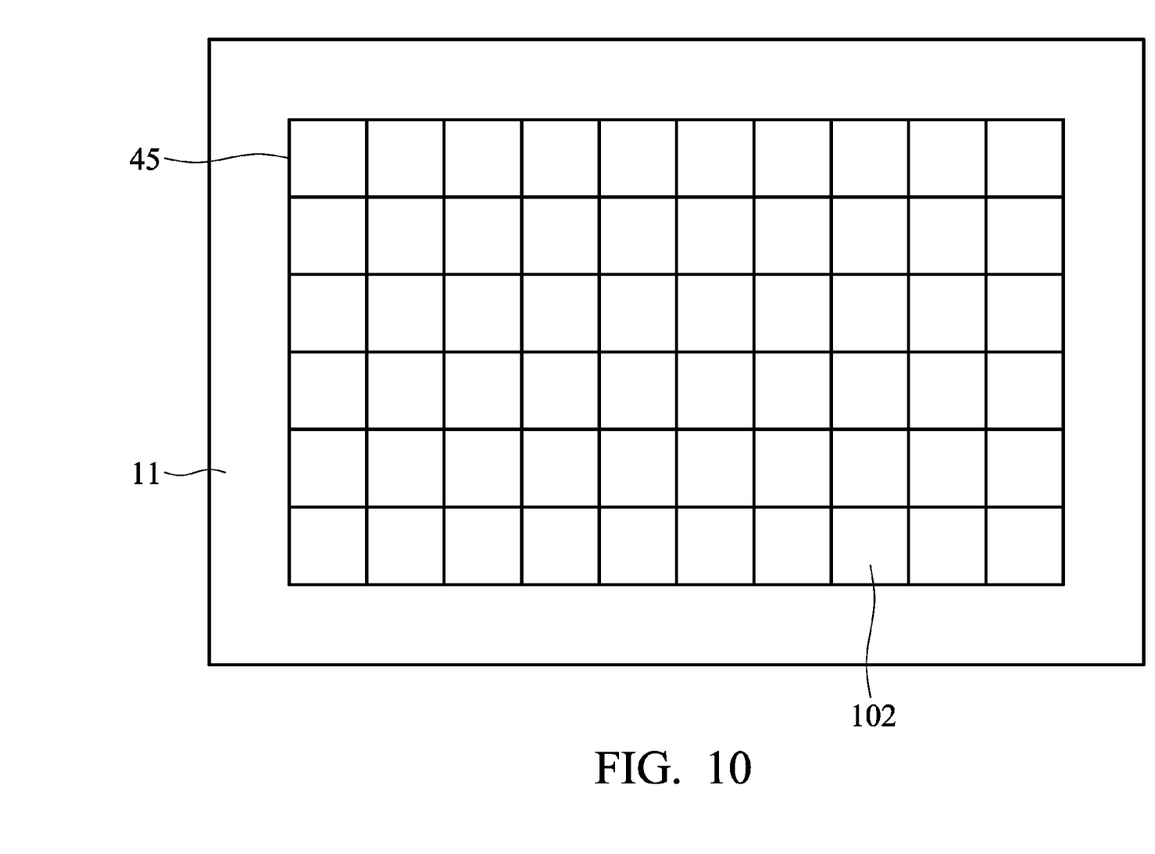
FIG. 10 depicts in a plan view the structure of FIG. 7.

FIG. 10 depicts in a plan view the optical grid 45 over substrate 11. Each portion defined by the grid bounds a pixel area 102. Many thousands or millions of pixels are provided in a practical device. The optical grid 45 and the coatings of metal, 51, and high-k dielectric, 53, and the passivation layer 55 may all be formed in a wafer level processing approach, and the image devices may be singulated after the passivation layer is complete. Alternatively, the individual devices may be processed after the wafer thinning steps to thin the substrate for the backside illumination, as described above.

The optical grid with the minor coating embodiments described above may have application to front side illumination devices, as well as CCD imagers, and other imaging applications, and the embodiments and the appended claims contemplate additional applications beyond those presented as examples herein.

Figure 11:
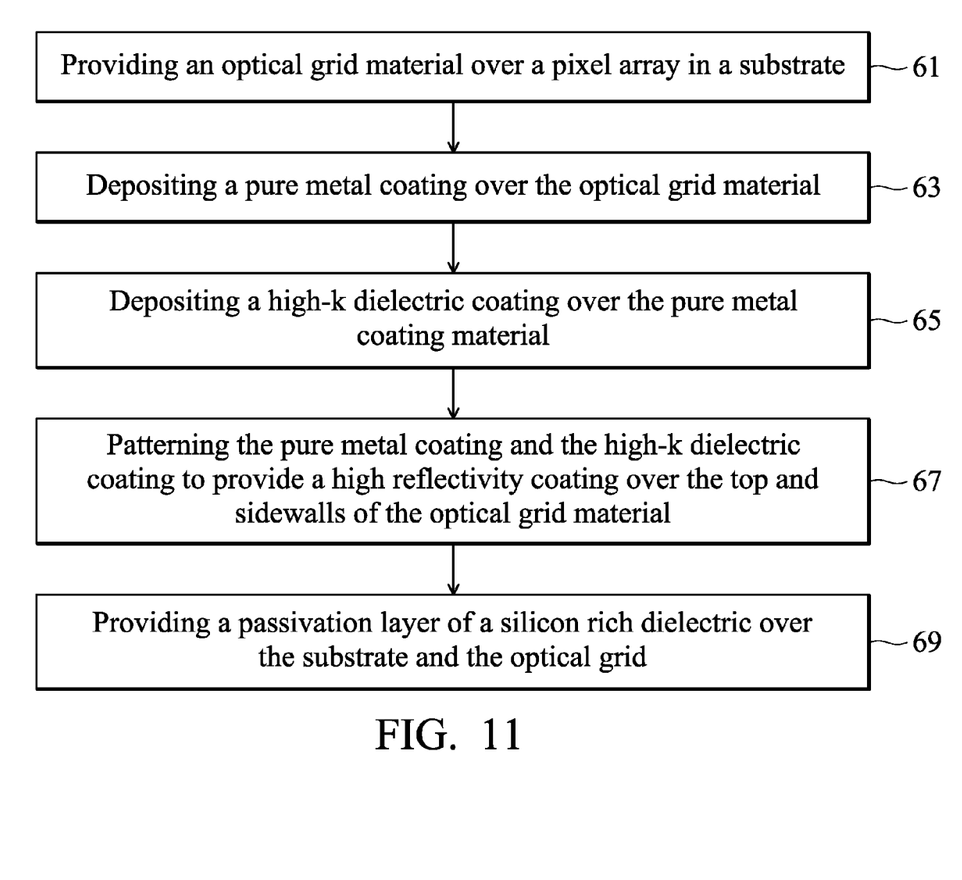
FIG. 11 depicts in a flow diagram the steps of a method embodiment.

FIG. 11 depicts in a flow diagram a method embodiment. In FIG. 11, at step 61, a grid of material defining pixel regions is provided over the backside of a substrate.

At step 63, the method continues by depositing a pure metal coating over the optical grid material. At step 65, a high-k dielectric coating with a refractive index greater than 2 is deposited over the pure metal coating. At step 67, the coatings are patterned to leave the optical grid with a highly reflective coating on the top and sidewalls of each portion of the optical grid.

At step 69, a passivation layer of a silicon rich dielectric material is formed over the optical grid material and the reflective coatings.

In addition to the example structures described herein, the substrate may also include other devices including active transistors, diodes, capacitors, inductors, resistors, bipolar and MOSFET devices, memory cells, analog devices, filters, transceivers, and the like formed in another portion of the substrate. Also, following the embodiment etching steps described herein for etching the substrate, interlayer dielectrics, conductors, additional devices formed in upper layers, and packaging material may be disposed over the substrate to form a complete microelectronic component such as an integrated circuit, solar cell, processor, or the like.

Use of the embodiments advantageously provides a highly reflective optical grid material. The embodiments are compatible with existing semiconductor processes. Methods for the embodiments use existing metal deposition, pattern, etch, and removal processes without the need for retooling or changes to chemistry or equipment.

In one embodiment, a method includes forming a layer of material over a pixel array area over the backside of a semiconductor substrate; patterning the layer of material using a photolithographic process to form an optical grid, the optical grid lying over the pixel array area and bounding a pixel sensor in each section of the pixel array area; depositing a pure metal coating over the optical grid, the pure metal coating comprising a metal that is at least 99% pure; depositing a dielectric layer having a refractive index of greater than about 2.0 over the pure metal coating; patterning the pure metal coating and the dielectric layer to form a reflective coating over a top and over sidewalls of each portion of the optical grid; and depositing a passivation layer over the optical grid, the passivation layer having a refractive index of less than about 2.0.

In yet another embodiment, the above method further includes the pure metal is one selected from copper and aluminum. In yet another embodiment, forming a layer of material comprises depositing a conductor. In a further embodiment, the conductor is one selected from the group consisting essentially of aluminum and copper. In still another embodiment, the methods include depositing a dielectric layer having a refractive index of greater than about 2.0 over the pure metal coating by depositing a dielectric having a dielectric constant greater than about 3.8. In yet another embodiment, the method includes depositing a dielectric layer having a refractive index of greater than about 2.0 over the pure metal coating by depositing one selected from tantalum oxide, titanium oxide, and aluminum oxide. In still another embodiment, the above methods include forming a layer of material over the backside of the pixel array area of a semiconductor substrate further including forming a layer of a conductor material.

In yet another alternative embodiment, depositing a passivation layer over the optical grid, the passivation layer having a refractive index of less than about 2.0 further includes depositing a silicon rich dielectric. In still another embodiment, depositing a passivation layer over the optical grid, the passivation layer having a refractive index of less than about 2.0 further includes depositing silicon rich silicon oxide. In still another embodiment, the reflectivity of the optical grid obtained is greater than 95%. In yet another embodiment depositing a pure metal coating over the optical grid, the pure metal coating being a metal that is at least 99% pure includes depositing Al or Cu that is at least 99.9% pure.

In another embodiment a semiconductor device includes a semiconductor substrate having a pixel array area comprising a plurality of photosensors disposed in the substrate, one of the photosensors corresponding to each pixel in the pixel array area; an optical grid material forming an optical grid on the backside of the semiconductor substrate and bounding each of the pixels in the pixel array, wherein the optical grid further comprises a pure metal coating over a base material that is at least 99% pure metal, and a high-k dielectric material over the pure metal coating that has a refractive index greater than 2.0. In yet another embodiment, the pure metal coating is one selected from the group consisting essentially of copper and aluminum. In a further embodiment, in the device above the high-k dielectric material further comprises a dielectric material with a dielectric constant k greater than 3.8. In still another embodiment, the semiconductor device further includes a passivation layer over the optical grid, the passivation layer comprising a dielectric material having a refractive index of less than about 2.0.

In yet another embodiment, a backside illuminated CIS device includes a semiconductor substrate having a pixel array area, comprising a plurality of photosensors formed on a front side surface of the semiconductor substrate, each of the photosensors forming a pixel in the pixel array area; an optical grid material disposed over a backside surface of the semiconductor substrate, the optical grid material patterned to form an optical grid that bounds each of the pixels in the pixel array area and extending above the semiconductor substrate, the optical grid having sidewalls and a top portion; and a highly reflective coating formed over the optical grid, comprising a pure metal coating of a metal that is at least 99% pure, and a high-k dielectric coating over the pure metal coating that has a refractive index of greater than about 2.0.

In still another embodiment the backside illuminated CIS device includes a passivation layer covering the optical grid and the backside of the substrate, comprising a dielectric material with a refractive index of less than about 2.0. In a further embodiment, the backside illuminated CIS device includes a metal coating that is at least 99% pure that further includes one of copper and aluminum. In yet another embodiment of the CIS device, the high-k dielectric coating over the pure metal coating further includes tantalum oxide, titanium oxide, or aluminum oxide. In still another embodiment, in the CIS device above the optical grid material includes a conductor selected from copper and aluminum.

Although the illustrative embodiment and its advantages have been described in detail, it should be understood that various changes, substitutions, and alterations can be made herein without departing from the spirit and scope of the invention as defined by the appended claims. For example, alternate materials, implant doses and temperatures may be implemented.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
    a semiconductor substrate having a pixel array area comprising a plurality of photosensors disposed in the substrate, the photosensors being formed along a front side surface of the semiconductor substrate, one of the photosensors corresponding to each pixel in the pixel array area; and
    an optical grid on the backside of the semiconductor substrate and bounding each of the pixels in the pixel array area, wherein the optical grid further comprises:
        a base material;
        a pure metal coating over the base material, the pure metal coating being at least 99% pure metal; and
        a high-k dielectric material over the pure metal coating, the high-k dielectric material having a refractive index greater than 2.0, wherein each of the base material, the pure metal coating, and the high-k dielectric material are patterned to have a grid pattern on the backside of the semiconductor substrate, and wherein the pure metal coating completely covers sidewalls of the grid pattern of the base material.

2. The semiconductor device of claim 1, wherein the pure metal coating is one selected from the group consisting essentially of 99% pure copper and 99% pure aluminum.

3. The semiconductor device of claim 1, wherein the high-k dielectric material further comprises a dielectric material with a dielectric constant k greater than 3.8.

4. The semiconductor device of claim 1 further comprising a passivation layer over the optical grid, the passivation layer comprising a dielectric material having a refractive index of less than about 2.0.

5. The semiconductor device of claim 1, further comprising an antireflective layer along the backside of the semiconductor substrate, the antireflective layer being interposed between the optical grid and the semiconductor substrate.

6. The semiconductor device of claim 1, further comprising a dielectric layer along the backside of the semiconductor substrate and wherein the optical grid is formed on the dielectric layer.

7. The semiconductor device of claim 1, where the pure metal coating is at least 99% pure metal.

8. The semiconductor device of claim 1, further comprising a passivation layer over the optical grid, the passivation layer comprising a dielectric material having a refractive index of less than about 2.0.

9. The semiconductor device of claim 1, wherein the optical grid extends between adjacent ones of the plurality of photosensors when viewed in a plan view.

10. The semiconductor device of claim 9, further comprising an antireflective layer along the backside of the semiconductor substrate.

11. The semiconductor device of claim 9, further comprising a dielectric layer along the backside of the semiconductor substrate and wherein the optical grid is formed on the dielectric layer.

12. The semiconductor device of claim 9, where the metal coating is at least 99% pure metal.

13. The semiconductor device of claim 12, wherein the pure metal coating is one selected from the group consisting essentially of 99% pure copper and 99% pure aluminum.

14. The semiconductor device of claim 9, wherein the high-k dielectric material further comprises a dielectric material with a dielectric constant k greater than 3.8.

15. The semiconductor device of claim 9, further comprising a passivation layer over the optical grid, the passivation layer comprising a dielectric material having a refractive index of less than about 2.0.

\* \* \* \* \*